US012371775B2

(12) United States Patent
Priedeman et al.

(10) Patent No.: US 12,371,775 B2
(45) Date of Patent: Jul. 29, 2025

(54) PISTON CRANK AGITATION MECHANISM FOR PHYSICAL VAPOR DEPOSITION CONFORMAL COATINGS ON POWDER

(71) Applicant: The Board of Trustees of The University of Alabama, Tuscaloosa, AL (US)

(72) Inventors: Jonathan Lake Priedeman, Northport, AL (US); Gregory Bruce Thompson, Tuscaloosa, AL (US)

(73) Assignee: The Board of Trustees of The University of Alabama, Tuscaloosa, AL (US)

( * ) Notice: Subject to any disclaimer, the term of this patent is extended or adjusted under 35 U.S.C. 154(b) by 377 days.

(21) Appl. No.: 17/979,392

(22) Filed: Nov. 2, 2022

(65) Prior Publication Data

US 2023/0143154 A1 May 11, 2023

Related U.S. Application Data

(60) Provisional application No. 63/276,902, filed on Nov. 8, 2021.

(51) Int. Cl.
*H01J 37/32* (2006.01)
*C23C 14/16* (2006.01)
(Continued)

(52) U.S. Cl.
CPC ............. *C23C 14/16* (2013.01); *C23C 14/28* (2013.01); *C23C 14/3407* (2013.01);
(Continued)

(58) Field of Classification Search
CPC .......... C23C 14/16; C23C 14/28; C23C 14/34; C23C 14/35; C23C 14/30; C23C 14/34;
(Continued)

(56) References Cited

U.S. PATENT DOCUMENTS 8,900,420 B2    12/2014   Veeraraghavan et al.

OTHER PUBLICATIONS

Hong and Kang, Hong, Y. J., & Kang, Y. C. (2015). One-pot synthesis of core-shell-structured tin oxide-carbon composite powders by spray pyrolysis for use as anode materials in Li-ion batteries. Carbon 88:262-269.
(Continued)

*Primary Examiner* — Rodney G McDonald
(74) *Attorney, Agent, or Firm* — Meunier Carlin & Curfman LLC

(57) ABSTRACT

Various implementations include a device for deposition of conformal coatings. The device includes a powder container, a connecting rod, and a crankshaft. The powder container has a first side configured to contain a powder and a second side. The connecting rod has a first end directly hingedly coupled to the second side of the powder container and a second end. The crankshaft has a longitudinal axis, a main shaft portion extending along the longitudinal axis, and a cam portion radially offset from and rotatable about the longitudinal axis. The second end of the connecting rod is directly rotatably coupled to the cam portion. Rotation of the crankshaft about the longitudinal axis causes the second end of the connecting rod to rotate about the longitudinal axis, causing the powder container to linearly oscillate between a first position and a second position.

19 Claims, 4 Drawing Sheets

(51) Int. Cl.
C23C 14/28 (2006.01)
C23C 14/34 (2006.01)
C23C 14/35 (2006.01)
F16C 3/06 (2006.01)

(52) U.S. Cl.
CPC ........ *C23C 14/35* (2013.01); *H01J 37/32715* (2013.01); *H01J 37/32733* (2013.01); *H01J 37/32761* (2013.01); *F16C 3/06* (2013.01)

(58) Field of Classification Search
CPC ......... C23C 14/50; C23C 14/223; F16C 3/06; H01J 37/32715; H01J 37/32733; H01J 37/32761
USPC .............................. 204/298.15; 118/728, 729
See application file for complete search history.

(56) References Cited

OTHER PUBLICATIONS

Swann, S. (1988). Magnetron sputtering. Physics in Technology. 19(2):67-75.
Tillmann, W., Fehr, A., & Stangier, D. (2019). Powder metallurgic fabricated plug targets for the synthesis of AlCrSiWN multicomponent coating systems. International Journal of Refractory Metals and Hard Materials, 85:105081.
Schmid, G. H. S., & Eisenmenger-Sittner, C. (2013). A method for uniformly coating powdery substrates by magnetron sputtering. Surface and Coatings Technology, 236:353-360.
L. Su, Y. Jing, Z. Zhou (2011). Li ion battery materials with core-shell nanostructures. Nanoscale 3(10):3967.
P. Qiu, X. Yang, T. Zhu, S. Sun, L. Jia, J. Li, (2020). Review on core-shell structured cathode for intermediate temperature solid oxide fuel cells. International Journal of Hydrogen Energy 45(43):23160-23173.
J.-c. Bradley, S. Babu, A. Mittal, P. Ndungu, B. Carroll, B. Samuel, (2001). Pulsed Bipolar Electrodeposition of Palladium onto Graphite Powder Pulsed Bipolar Electrodeposition of Palladium onto Graphite. Journal of The Electrochemical Society 148(9):C647-C651.
N. Ma, A. F. Marshall, S. S. Gambhir, J. Rao, (2010). Facile Synthesis, Silanization and Biodistribution of Biocompatible Quantum Dots. Small 6(14):1520-1528.
Z. Mahdavi, H. Rezvani, M. K. Moraveji, (2020). Core-shell nanoparticles used in drug deliver-microuidics: a review. RSC Advances 10:18280-18295.
H. Chen, L. Zhang, M. Li, G. Xie, (2020). Synthesis of Core/Shell Micro/Nanoparticles and Their Tribological Application: A Review. Materials 13:4590.
R. Beetstra, U. Lafont, J. Nijenhuis, E. M. Kelder, J. R. van Ommen, (2009). Atmospheric Pressure Process for Coating Particles Using Atomic Layer Deposition. Chemical Vapor Deposition 15:227-233.
W. Lu, X. Guo, Y. Luo, Q. Li, R. Zhu, H. Pang, (2019). Core-shell materials for advanced batteries. Chemical Engineering Journal 355:208-237.
H. Wang, Y. Chen, J. Li, L. Guo, M. Fang, (2020). Review of encapsulated salt hydrate core-shell phase change materials, KONA Powder and Particle Journal 37:85-96.
K. C. Ho, L. Y. Lin, (2019). A review of electrode materials based on core-shell nanostructures for electrochemical supercapacitors. Journal of Materials Chemistry A 7(8):3516-3530.
S. Bhogal, K. Kaur, A. K. Malik, C. Sonne, S. S. Lee, K. H. Kim, (2020). Core-shell structured molecularly imprinted materials for sensing applications, TrAC—Trends in Analytical Chemistry 133:116043.
D. S. Tucker, A. O'Connor, R. Hickman, (2015). A Methodology for Producing Uniform Distribution of UO2 in a Tungsten Matrix. Journal of Physical Science and Application 5 (4) 255-262.
T. G. Duffin, K. M. Benensky, S. J. Zinkle, M. W. Barnes, D. S. Tucker, (2018). Production and hot hydrogen testing of subscale molybdenum cermets for nuclear thermal propulsion, in: 2018 Joint Propulsion Conference, pp. 1-8.
K. Palomares, R. Howard, T. Steiner, (2020). Assessment of near-term fuel screening and qualification needs for nuclear thermal propulsion systems, Nuclear Engineering and Design 367:110765.
C. Haertling, R. J. Hanrahan, (2007). Literature review of thermal and radiation performance parameters for high-temperature, uranium dioxide fueled cermet materials, Journal of Nuclear Materials 366 (3) 317-335.
R. R. Hickman, J. W. Broadway, O. R. Mireles, (2012). Fabrication and Testing of CERMET Fuel Materials for Nuclear Thermal Propulsion, 48th AIAA/ASME/SAE/ASEE Joint Propulsion Conference & Exhibit 3819.
O. R. Mireles, J. W. Broadway, R. R. Hickman, (2012). Development of a Fluidized Bed CVD System for Coating UO2 Particles with Tungsten. Nuclear and Emerging Technologies for Space 3021.
D. S. Tucker, M. W. Barnes, L. Hone, S. Cook, (2017). High density, uniformly distributed W/UO2 for use in Nuclear Thermal Propulsion. Journal of Nuclear Materials 486 246-249.
A. Asatekin, M. C. Barr, S. H. Baxamusa, K. K. Lau, W. Tenhae, J. Xu, K. K. Gleason, (2010). Designing polymer surfaces via vapor deposition. Materials Today 13(5):26-33.
J. A. Raiford, S. T. Oyakhire, S. F. Bent, (2020). Applications of atomic layer deposition and chemical vapor deposition for perovskite solar cells. Energy and Environmental Science 13(7):1997-2023.
M. Xia, Q. Yao, H. Yang, T. Guo, X. Du, Y. Zhang, G. Li, Y. Luo, Preparation of Bi2O3/Al core-shell energetic composite by two-step ball milling method and its application in solid propellant, Materials 12:(11), 1879.
C. J. Marvel, J. A. Smeltzer, B. C. Hornbuckle, K. A. Darling, M. P. Harmer, (2020). On the reduction and effect of non-metallic impurities in mechanically alloyed nanocrystalline Ni—W alloys, Acta Materialia 200:12-23.
X. Zhou, J. D. Schuler, C. M. Grigorian, D. Tweddle, T. J. Rupert, L. Li, G. B. Thompson, (2020). Influence and comparison of contaminate partitioning on nanocrystalline stability in sputter-deposited and ball-milled Cu—Zr alloys, Journal of Materials Science 55(35):16758-16779.
D. S. Tucker, Y. Wu, J. Burns, (2018) Uranium migration in spark plasma sintered W/UO2 CERMETS, Journal of Nuclear Materials 500 141-144.
W. F. Cureton, J. Zillinger, J. Rosales, R. P. Wilkerson, M. Lang, M. Barnes, (2020). Microstructural evolution of Mo—UO2 cermets under high temperature hydrogen environments. Journal of Nuclear Materials 538:152297.
G. Schmid, C. Eisenmenger-sittner, J. Hell, M. Horkel, M. Keding, H. Mahr, (2010) Optimization of a container design for depositing uniform metal coatings on glass microspheres by magnetron sputtering, Surface & Coatings Technology 205(7):1929-1936.
D. M. Baechle, J. D. Demaree, J. K. Hirvonen, E. D. Wetzel, (2013) Magnetron sputter deposition onto fluidized particle beds, Surface & Coatings Technology 221:94-103.
V. A. Chlenov, N. V. Mikhailov, (1965) Some properties of a vibrating uidized bed, Journal of Engineering Physics 9 (2) 137-139.
A. F. Ryzhkov, B. A. Putrik, (1993) Formation of a vibrofluidized fine-grain bed, Journal of Engineering Physics and Thermophysics 65 (3) 837-848.

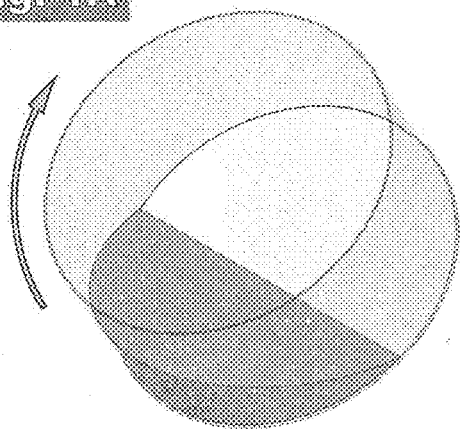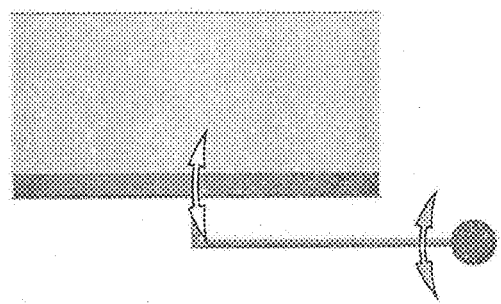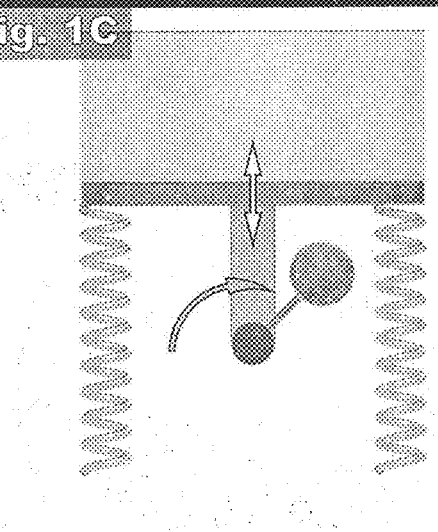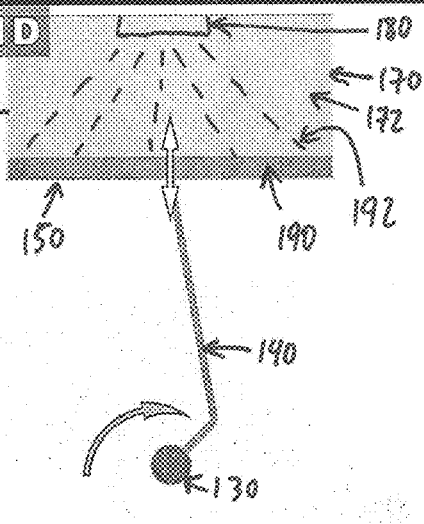

PISTON CRANK AGITATION MECHANISM FOR PHYSICAL VAPOR DEPOSITION CONFORMAL COATINGS ON POWDER

STATEMENT OF GOVERNMENT INTEREST

This invention was made with government support under Grant No. 80NSSC18K0255 awarded by the National Aeronautics and Space Administration. The government has certain rights in the invention.

BACKGROUND

Applying a thin film coating to powder under vacuum conditions requires mechanical agitation of the powder to achieve a uniform film. Previous efforts have successfully produced thin film coatings on powder but did not make provision for scalability. Furthermore, current systems are not able to uniformly and efficiently coat the powder.

Some current devices include rotating vessel designs that serve to mix the powder during sputter deposition, as shown schematically in FIG. 1A. Such systems do not completely use the container for coating, and the powder collects at the bottom of the (tilted) vessel. Thus, even with uniform sputtered coating, the reduced coating on the powder from these devices is non-uniform, often to the point of forming separate platinum agglomerates.

Other current devices employ a rapidly oscillating vessel to induce agitation in the powders contained therein, as shown schematically in FIG. 1B. The motion is produced by small angle, oscillating rotations of a shaft with a cantilever beam (at the end of which the powder container is affixed), producing near-linear displacements at the end of the beam. Although these systems are able to uniformly coat powders, they did not address scalability. In other words, these designs make no provision to expand the design of their system for processing large quantities of powder.

Another design of current devices utilizes a shuttle constrained by linear bearings and guides and driven by an eccentric rotating mass attached thereto and held against gravity by springs, as shown schematically in FIG. 1C. This design appears to be of simple mechanical design and yields linear motion. However, the requirements for the motor are stringent, as it must withstand the oscillations of the shuttle as well as be compatible with vacuum. Because of these motor requirements, the mechanical design is not as simple as it appears. Further, the use of springs complicate scalability, as their presence introduces the possibility of resonance. Again, because the system dynamics must be accounted for in each scenario, the mechanical design is not simple.

Thus, a need exists for a scalable mechanism for mechanical powder agitation that is of simple mechanical design, maximizes powder area exposed to the sputtering gun, and provide uniform agitation.

SUMMARY

Various implementations include a device for deposition of conformal coatings. The device includes a powder container, a connecting rod, and a crankshaft. The powder container has a first side and a second side opposite and spaced apart from the first side. The first side is configured to contain a powder. The connecting rod has a first end and a second end opposite and spaced apart from the first end. The first end is directly hingedly coupled to the second side of the powder container. The crankshaft has a crankshaft longitudinal axis, a main shaft portion extending along the crankshaft longitudinal axis, and a cam portion radially offset from and rotatable about the crankshaft longitudinal axis. The second end of the connecting rod is directly rotatably coupled to the cam portion. Rotation of the crankshaft about the crankshaft longitudinal axis causes the second end of the connecting rod to rotate about the crankshaft longitudinal axis such that the connecting rod causes the powder container to linearly oscillate between a first position and a second position. The powder container is closer in the first position than in the second position to the crankshaft longitudinal axis.

In some implementations, the device further includes a base having a first surface and a second surface. In some implementations, the crankshaft is rotatably coupled to the first surface of the base, and the powder container oscillates in a direction perpendicular to the second surface of the base.

In some implementations, the device further includes one or more linear bearings coupled to the powder container for guiding the powder container between the first position and the second position.

In some implementations, the crankshaft includes tool steel.

In some implementations, the device further includes one or more rotational bearings. In some implementations, the crankshaft extends through and rotates relative to the one or more rotational bearings. In some implementations, the one or more rotational bearings include polyimide.

In some implementations, the device further includes a housing defining a vacuum chamber. In some implementations, the powder container is at least partially disposed within the vacuum chamber.

In some implementations, the device further includes a vacuum source in fluid communication with the housing. In some implementations, the vacuum source is configured to cause a lower pressure within the vacuum chamber than in an ambient environment.

In some implementations, the device further includes a physical vapor deposition source for depositing a coating material toward the first side of the powder container. In some implementations, the physical vapor deposition source includes a magnetron sputtering device. In some implementations, the physical vapor deposition source includes a pulsed-laser physical vapor deposition source. In some implementations, the physical vapor deposition source includes an electron-beam physical vapor deposition source.

In some implementations, the device further includes a motor for causing rotation of the crankshaft about the crankshaft longitudinal axis.

In some implementations, the powder container oscillates at a frequency equal to a rotational speed of the crankshaft about the crankshaft longitudinal axis.

In some implementations, the powder container includes aluminum.

In some implementations, the first side of the powder container defines a concave surface that at least partially defines a powder chamber.

In some implementations, the first side of the powder container defines at least one wall extending in a direction from the first position to the second position. In some implementations, the at least one wall at least partially defines a powder chamber.

In some implementations, the first side of the powder container defines at least one inclined side wall that at least partially defines a powder chamber.

In some implementations, the first side of the powder container defines at least one concave side wall that at least partially defines a powder chamber.

BRIEF DESCRIPTION OF DRAWINGS

Example features and implementations are disclosed in the accompanying drawings. However, the present disclosure is not limited to the precise arrangements and instrumentalities shown.

FIG. 1A shows a schematic view of a prior art system including a rotating vessel design that serves to mix the powder during sputter deposition of conformal coatings.

FIG. 1B shows a schematic view of a prior art system including a rapidly oscillating vessel to induce agitation in the powders during sputter deposition of conformal coatings.

FIG. 1C shows a schematic view of a prior art system including a shuttle constrained by linear bearings and guides and driven by an eccentric rotating mass attached thereto and held against gravity by springs to introduce agitation during sputter deposition of conformal coatings.

FIG. 1D shows a schematic view of a device for deposition of conformal coatings, according to one implementation.

DETAILED DESCRIPTION

The devices, systems, and methods described herein include a piston-crank mechanism used to agitate powder by applying an oscillation to a powder container containing that powder, as shown schematically in FIG. 1D. This powder container is open to a physical vapor deposition source, which applies conformal coatings to the powder. The devices, systems, and methods described herein use of the piston-crank mechanism to provide agitation, rather than alternate means.

The piston-crank agitation system applies an oscillation of fixed amplitude in a linear manner. This characteristic allows the powder container to be as large as the vacuum chamber will permit and/or for powder to be dispersed across the entire base of the powder container. This maximizes coating efficacy in comparison to other systems.

The devices, systems, and methods described herein may be used to produce conformal coatings on powders (e.g., core-shell structures) with minimal exposure of the powders or coatings to contaminants, which have applications in the energy, aerospace, and nuclear industries. Such applications are particularly useful for additive manufacturing where precise tailoring of powder properties (composition, surface morphology/characteristics) is required.

Great flexibility in the process is inherent, as most metals may be readily deposited. Potential applications include: nuclear thermal propulsion, high temperature composites, thermite propellants/explosives, and nanocrystalline materials. The devices, systems, and methods described herein are scalable (there are no geometric limitations inherent to the concept) and applies coatings with approximately four times the "deposition efficacy" (volume of coating/energy input) in comparison to alternate systems published in the literature.

The piston-crank design of the devices, systems, and methods described herein, like an automobile piston engine, trades some mechanical complexity for reliable dynamic behavior. The system produces linear motion of the powder container, which may be as large as desired, so long as the mechanical components may safely handle the stresses imposed during operation. While the mathematical equations describing the dynamic motion of the system are complex, the motion is not. The powder container has a fixed mechanical amplitude that is unaffected by mechanical frequency or mass of the powder in the container. Thus, once the system is constructed, a user may fill the container with powder and run the system without needing to make any adjustments to avoid undesirable system behavior, such as resonance.

Figure 2:
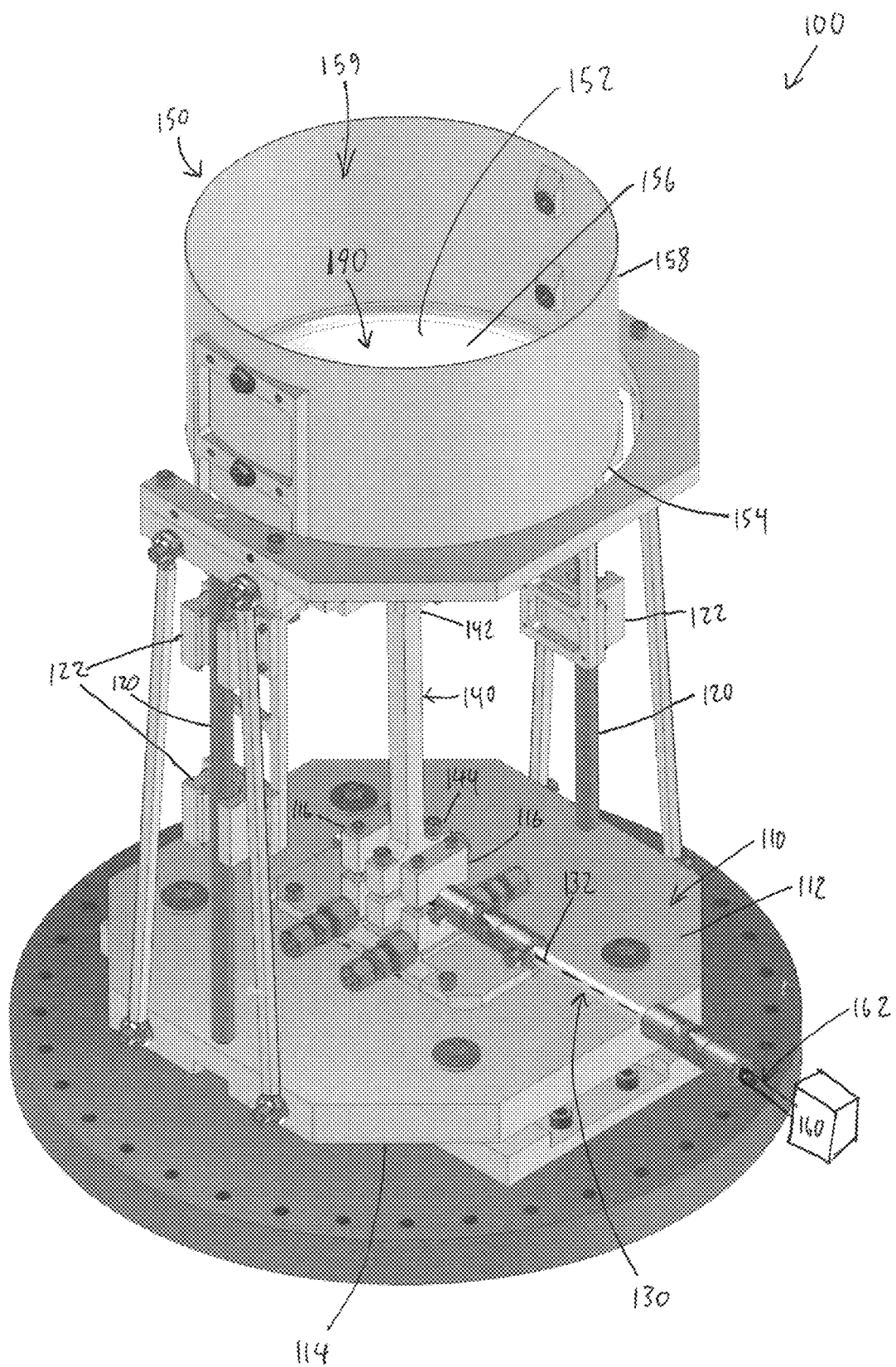
FIG. 2 is a perspective view of a device for deposition of conformal coatings, according to another implementation.

FIG. 2 shows a device 100 for deposition of conformal coatings, according to aspects of a first implementation. The device 100 includes a base 110, a crankshaft 130, a connecting rod 140, a powder container 150, a vacuum chamber 172, and a physical vapor deposition source 180.

The base 110 has a first surface 112 and a second surface 114 opposite and spaced apart from the first surface 112. Two rotational bearings 116 are coupled to the first surface 112 of the base 110 such that the openings of the rotational bearings 116 are axially aligned with each other.

The rotational bearings 116 shown in FIG. 2 include a polyimide (e.g., Vespel®, a polyimide available from DuPont™) Vespel Polyimide plain bearings, but in other implementations, the rotational bearings include ball bearings (e.g., $Si_3N_4$ ball bearings), any other type of plain bearing (e.g., Rulon J plain bearings), or bearing made of any material such as Frelon, Rulon 641, Rulon LR, or any material capable of withstanding the rotational and radial loads of the system. In some implementations, the device can include any number of one or more rotational bearings.

Figure 3:
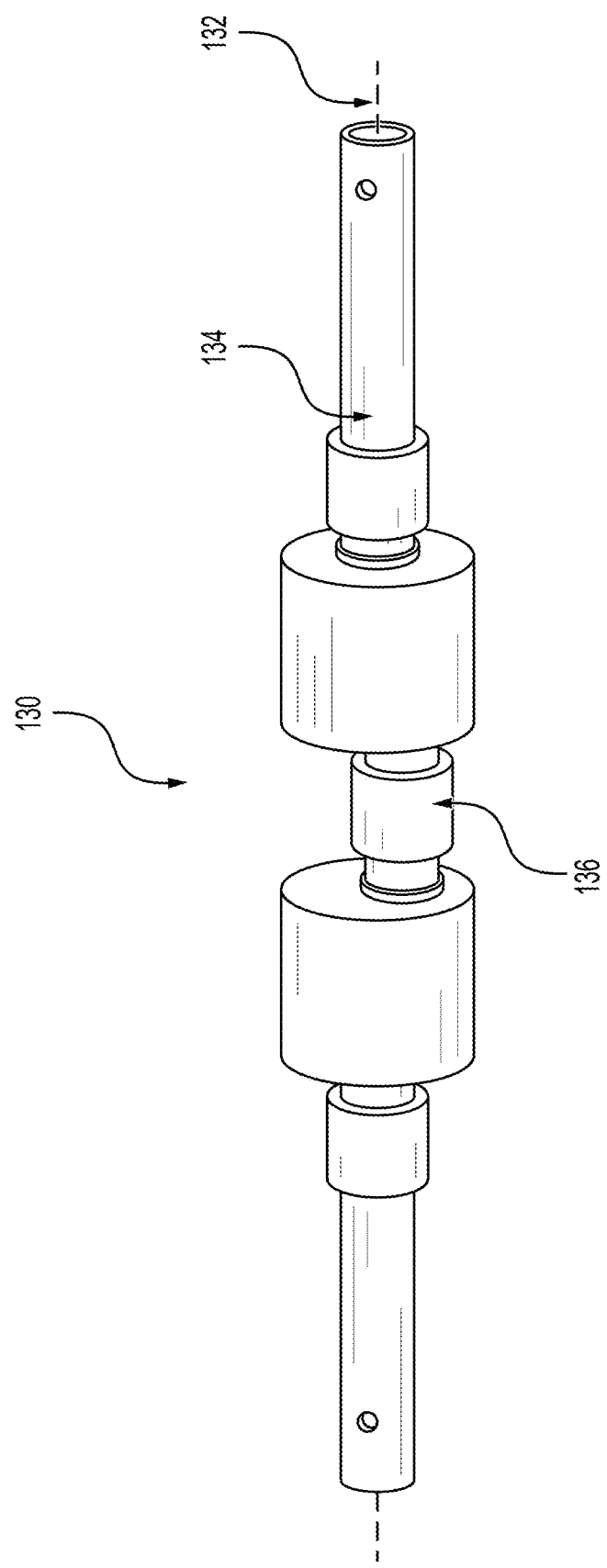
FIG. 3 is a perspective view of the crankshaft of the device of FIG. 2.

FIG. 3 shows the crankshaft 130 of the device 100 shown in FIG. 2. The crankshaft 130 has a crankshaft longitudinal axis 132, a main shaft portion 134 extending along the crankshaft longitudinal axis 132, and a cam portion 136 radially offset from and rotatable about the crankshaft longitudinal axis 132. The main shaft portion 134 of the crankshaft 130 extends through the openings of the two rotational bearings 116 and rotates relative to the two rotational bearings 116 such that the crankshaft 130 is rotatably coupled to the first surface 112 of the base 110.

The crankshaft 130 shown in FIGS. 2 and 3 includes tool steel, but in other implementations, the crankshaft includes stainless steel (e.g. 316 or 17-4 PH stainless steel), aluminum (e.g., 6061 aluminum), titanium or a titanium alloy, a nickel-based alloy, or any other material capable of withstanding the rotational and radial loads of the system.

The connecting rod 140 has a first end 142 and a second end 144 opposite and spaced apart from the first end 142. The second end 144 of the connecting rod 140 is directly rotatably coupled to the cam portion 136 of the crankshaft 130.

The connecting rod 140 shown in FIG. 2 includes aluminum (6061), but in other implementations, the connecting rod includes stainless steel, tool steel, titanium or a titanium alloy, a nickel-based alloy, or any other material capable of withstanding the oscillating loads of the system.

Figure 4A:
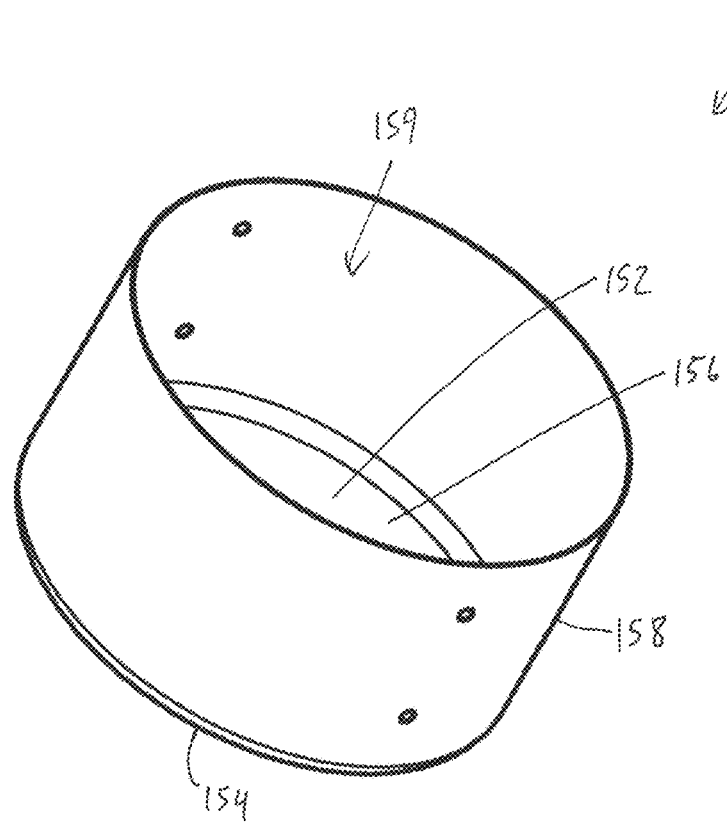
FIG. 4A is a perspective view of the powder container of the device of FIG. 2.
Figure 4B:
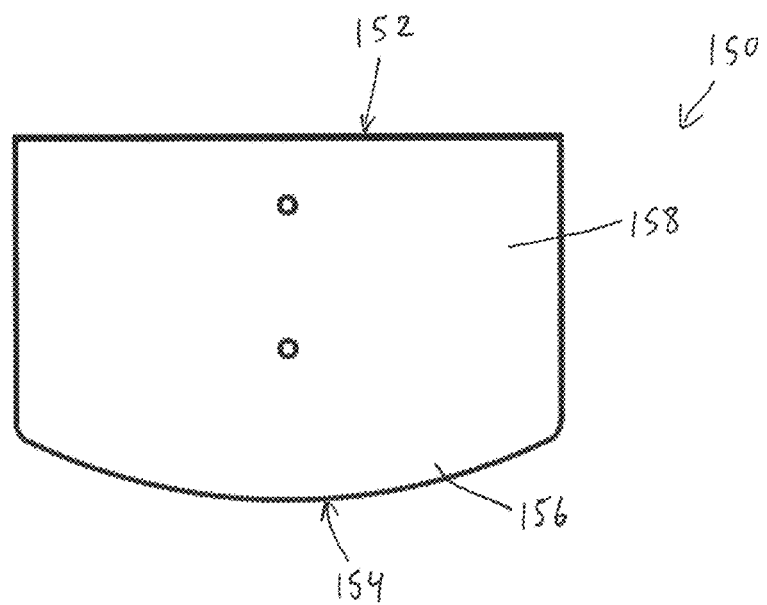
FIG. 4B is a side view of the powder container of the device of FIG. 2.

FIGS. 4A and 4B show the powder container 150 of the device 100 shown in FIG. 2. The powder container 150 has a first side 152 and a second side 154 opposite and spaced apart from the first side 152. The first end 142 of the connecting rod 140 is directly hingedly coupled to the second side 154 of the powder container 150. The first side 152 of the powder container 150 defines a concave bottom surface 156 and a side wall 158 extending from the bottom surface 156 to form a cylindrical wall. The concave bottom surface 156 and cylindrical side wall 158 define a powder chamber 159 for containing powder 190.

The powder container 150 shown in FIGS. 2, 4A, and 4B includes aluminum, but in other implementations, the powder container includes stainless steel, tool steel, titanium or a titanium alloy, a nickel-based alloy, or any other material capable of withstanding the oscillating loads of the system and containing powder.

Although the first side 152 of the powder container 150 shown in FIGS. 2, 4A, and 4B includes a concave bottom surface 156, in other implementations, the bottom surface of the first side of the powder container is flat or includes any other concave and/or convex contours. Although the first side 152 of the powder container 150 shown in FIGS. 2, 4A, and 4B includes a cylindrical side wall 158 extending from the bottom surface 156, in other implementations, the first side of the powder container has any other cross-sectional shape, such as ovate, triangular, rectangular, or any other shape. In some implementations, the first side of the powder container defines at least one inclined side wall, at least one concave side wall, and/or any other side walls and/or bottom surfaces capable of defining a powder chamber.

The base 110 further includes two guide tracks 120 and four linear bearings 122. The two guide tracks 120 extend perpendicularly to the first surface 112 of the base 110. Two linear bearings 122 are slidingly coupled to each of the guide tracks 120, and the linear bearings 122 are coupled to the powder container 150 for guiding the powder container 150 between the first position and the second position, as discussed below.

An output shaft 162 of a motor 160 is coupled to the main shaft portion 134 of the crankshaft 130 for causing rotation of the crankshaft 130 about the crankshaft longitudinal axis 132.

In use, a powder 190 is disposed within the powder chamber 159 of the powder container 150. The motor 160 is activated to cause rotation of the main shaft portion 134 of the crankshaft 130 about the crankshaft longitudinal axis 132. The rotation of the main shaft portion 134 of the crankshaft 130 about the crankshaft longitudinal axis 132 causes the cam portion 136 of the crankshaft 130 and the second end 144 of the connecting rod 140 that is rotatably coupled to the cam portion 136 to rotate about the crankshaft longitudinal axis 132, as shown in FIG. 1D. As the second end 144 of the connecting rod 140 rotates about the crankshaft longitudinal axis 132, the powder container 150 that is hingedly coupled to the first end 142 of the connecting rod 140 and constrained to a linear path by the linear bearings 122 is caused to linearly oscillate between a first position and a second position, wherein the powder container 150 is closer in the first position than in the second position to the crankshaft longitudinal axis 132. Because the guide tracks 120 to which the linear bearings 122 are slidingly coupled extend perpendicularly to the first surface 112 of the base 110, the powder container 150 oscillates in a direction perpendicular to the first 112 and second surfaces 114 of the base 110.

Because one rotation of the cam portion 136 of the crankshaft 130 causes the powder container 150 to move from the first position, to the second position, and back to the first position, the powder container 150 oscillates at a frequency equal to a rotational speed of the crankshaft 130 about the crankshaft longitudinal axis 132. Thus, the frequency of the oscillation of the powder container 150 can be selected by selecting a specific rotational speed of the output shaft 162 of the motor 160. Furthermore, because the powder container 150 and output shaft 162 of the motor 160 are distantly coupled to each other through rigid components and is not meaningfully affected by any flexing or slipping of components, the oscillation frequency of the powder container 150 is as consistent as the rotational speed of the motor 160.

The powder 190 shown in FIG. 2 is a spherical-type powder (e.g., particles), but in other implementations, the powder used can be any other shape, such as linear powder (e.g., nanotubes, nanorods) or planar (e.g., nanosheets, nanoplates).

The device 100 can further include a housing 170 defining a vacuum chamber 172, as shown in FIG. 1D. Only a portion of the powder container 150 in FIG. 1D is disposed within the vacuum chamber 172, but in other implementations, any number of components can be disposed within the vacuum chamber as long as the powder container is at least partially disposed within the vacuum chamber. The device 100 also includes a vacuum source 174 in fluid communication with the housing 170. The vacuum source 174 is configured to cause the vacuum chamber 172 to be a lower pressure than the ambient environment. In some implementations, the vacuum source is capable of causing the vacuum chamber to be a complete vacuum.

As shown in FIG. 1D, the device 100 can further include a physical vapor deposition source 180 for depositing a coating material 192 toward the first side 152 of the powder container 150 such that the coating material 192 is directed down onto the powder 190 within the powder container 150. The physical vapor deposition source 180 is disposed within the vacuum chamber 172 of the housing 170 such that the coating material 192 exiting the physical vapor deposition source 180 is not subjected to external factors such as air movement. This allows the coating material 192 to be deposited onto the powder 192 more uniformly. The physical vapor deposition source 180 shown in FIG. 1D is a magnetron sputtering device, but in other implementations, the physical vapor deposition source is a pulsed-laser physical vapor deposition source, an electron-beam physical vapor deposition source, or any other physical vapor deposition source known in the art. The physical vapor deposition source 180 provides the benefits of being able to easily deposit most metals and alloys, avoiding exposure to secondary substances (e.g., hydrogen), and good adherence of coating material onto the powder. However, in other implementations, the device can include any other deposition source known in the art.

As the powder container 150 of the device 100 linearly oscillates between the first position and the second position, the powder 190 disposed within the powder container 150 is tossed in a direction from the first position toward the second position. As discussed above, the structure of the device 100 disclosed herein allows for consistent linear oscillation of the powder container 150, which creates consistent movement of the powder 190 within the powder container 150. The even deposition of the coating material 192 from the physical vapor deposition source 180 onto the moving powder 190 creates a more uniform coating of the coating material 192 on the powder 190.

The devices and methods disclosed herein can be modified to move at different fixed amplitudes and at different frequencies by making changes to the dimensions of various components and to the rotational speed of the crankshaft. The devices also allow for scaling of the system.

A number of implementations have been described. Nevertheless, it will be understood that various modifications may be made without departing from the spirit and scope of the claims. Accordingly, other implementations are within the scope of the following claims.

Certain terminology is used herein for convenience only and is not to be taken as a limitation on the present claims. In the drawings, the same reference numbers are employed for designating the same elements throughout the several figures. A number of examples are provided, nevertheless, it will be understood that various modifications can be made without departing from the spirit and scope of the disclosure herein. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. Although the terms "comprising" and "including" have been used herein to describe various implementations, the terms "consisting essentially of" and "consisting of" can be used in place of "comprising" and "including" to provide for more specific implementations and are also disclosed.

Disclosed are materials, systems, devices, methods, compositions, and components that can be used for, can be used in conjunction with, can be used in preparation for, or are products of the disclosed methods, systems, and devices. These and other components are disclosed herein, and it is understood that when combinations, subsets, interactions, groups, etc. of these components are disclosed that while specific reference of each various individual and collective combinations and permutations of these components may not be explicitly disclosed, each is specifically contemplated and described herein. For example, if a device is disclosed and discussed each and every combination and permutation of the device, and the modifications that are possible are specifically contemplated unless specifically indicated to the contrary. Likewise, any subset or combination of these is also specifically contemplated and disclosed. This concept applies to all aspects of this disclosure including, but not limited to, steps in methods using the disclosed systems or devices. Thus, if there are a variety of additional steps that can be performed, it is understood that each of these additional steps can be performed with any specific method steps or combination of method steps of the disclosed methods, and that each such combination or subset of combinations is specifically contemplated and should be considered disclosed.

What is claimed is:

1. A device for deposition of conformal coatings, the device comprising:
a powder container having a first side and a second side opposite and spaced apart from the first side, wherein the first side is configured to contain a powder;
a connecting rod having a first end and a second end opposite and spaced apart from the first end, wherein the first end is hinged in direct coupling to the second side of the powder container; and
a crankshaft having a crankshaft longitudinal axis, a main shaft portion extending along the crankshaft longitudinal axis, and a cam portion radially offset from and rotatable about the crankshaft longitudinal axis, wherein the second end of the connecting rod is directly rotatably coupled to the cam portion,
wherein rotation of the crankshaft about the crankshaft longitudinal axis causes the second end of the connecting rod to rotate about the crankshaft longitudinal axis such that the connecting rod causes the powder container to linearly oscillate between a first position and a second position, wherein the powder container is closer in the first position than in the second position to the crankshaft longitudinal axis.

2. The device of claim 1, further comprising a base having a first surface and a second surface, wherein the crankshaft is rotatably coupled to the first surface of the base, and the powder container oscillates in a direction perpendicular to the second surface of the base.

3. The device of claim 1, further comprising one or more linear bearings coupled to the powder container for guiding the powder container between the first position and the second position.

4. The device of claim 1, wherein the crankshaft comprises tool steel.

5. The device of claim 1, further comprising one or more rotational bearings, wherein the crankshaft extends through and rotates relative to the one or more rotational bearings.

6. The device of claim 5, wherein the one or more rotational bearings comprise polyimide.

7. The device of claim 1, further comprising a housing defining a vacuum chamber, wherein the powder container is at least partially disposed within the vacuum chamber.

8. The device of claim 7, further comprising a vacuum source in fluid communication with the housing, wherein the vacuum source is configured to cause a lower pressure within the vacuum chamber than in an ambient environment.

9. The device of claim 1, further comprising a physical vapor deposition source for depositing a coating material toward the first side of the powder container.

10. The device of claim 9, wherein the physical vapor deposition source comprises a magnetron sputtering device.

11. The device of claim 9, wherein the physical vapor deposition source comprises a pulsed-laser physical vapor deposition source.

12. The device of claim 9, wherein the physical vapor deposition source comprises an electron-beam physical vapor deposition source.

13. The device of claim 1, further comprising a motor for causing rotation of the crankshaft about the crankshaft longitudinal axis.

14. The device of claim 1, wherein the powder container oscillates at a frequency equal to a rotational speed of the crankshaft about the crankshaft longitudinal axis.

15. The device of claim 1, wherein the powder container comprises aluminum.

16. The device of claim 1, wherein the first side of the powder container defines a concave surface that at least partially defines a powder chamber.

17. The device of claim 1, wherein the first side of the powder container defines at least one wall extending in a direction from the first position to the second position, wherein the at least one wall at least partially defines a powder chamber.

18. The device of claim 1, wherein the first side of the powder container defines at least one inclined side wall that at least partially defines a powder chamber.

19. The device of claim 1, wherein the first side of the powder container defines at least one concave side wall that at least partially defines a powder chamber.

* * * * *